(12) United States Patent
Aminzadeh et al.

(10) Patent No.: US 6,649,529 B2
(45) Date of Patent: Nov. 18, 2003

(54) METHOD OF SUBSTRATE PROCESSING AND PHOTORESIST EXPOSURE

(75) Inventors: Mehran Aminzadeh, Saratoga, CA (US); Michael R. Fahy, Dublin (IE)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/930,840

(22) Filed: Aug. 15, 2001

(65) Prior Publication Data

US 2003/0036281 A1 Feb. 20, 2003

(51) Int. Cl.[7] .............................................. H01L 21/302
(52) U.S. Cl. ........................ 438/707; 438/716; 430/311; 355/53
(58) Field of Search .............................. 438/707, 716; 430/311, 312, 396; 355/53

(56) References Cited

U.S. PATENT DOCUMENTS

| | | | |
|---|---|---|---|
| 4,504,726 A | * 3/1985 | Hosaka et al. | 219/121.68 |
| 5,091,331 A | * 2/1992 | Delgado et al. | 438/458 |
| 5,461,237 A | 10/1995 | Wakamoto et al. | |
| 5,482,887 A | * 1/1996 | Duinkerken et al. | 438/458 |
| 5,666,189 A | * 9/1997 | Rostoker et al. | 355/53 |
| 5,747,221 A | * 5/1998 | Kim et al. | 430/311 |
| 5,838,450 A | * 11/1998 | McCoy et al. | 356/401 |
| 6,145,422 A | * 11/2000 | Katamachi et al. | 83/74 |
| 6,171,176 B1 | * 1/2001 | Kajiyama et al. | 451/28 |

FOREIGN PATENT DOCUMENTS

JP       15-283310       10/1993

OTHER PUBLICATIONS

PCT Search Report, PCT/US 02/ 23090, mailed Jul. 2, 2003.

* cited by examiner

*Primary Examiner*—Kin-Chan Chen
(74) *Attorney, Agent, or Firm*—Blakely, Sokoloff, Taylor & Zafman LLP

(57) ABSTRACT

A method is described for improving the exposure focus for modern steppers used in the lithography of semiconductor substrates such as wafers. A wafer is sawed from a semiconductor ingot in a particular direction relative to a reference point on the ingot. As a result of the sawing, a series of raised and recessed formations manifest on the surface of the wafer. After various layers have been added to the wafer and the photoresist layer is ready to be removed, the wafer is aligned with the stepper so that a dynamic focus area of the stepper is aligned with the formations and/or the sawing direction. Such alignment improves the critical dimension control and reduces variability in printing small geometry features during lithography, resulting in higher yields.

28 Claims, 14 Drawing Sheets

METHOD OF SUBSTRATE PROCESSING AND PHOTORESIST EXPOSURE

BACKGROUND OF THE INVENTION

1). Field of the Invention

This invention relates generally to a method of substrate processing and, more specifically, to a method of photoresist exposure.

2). Discussion of Related Art

Integrated circuits are manufactured on silicon and other semiconductor substrates often in the form of wafers. A wafer is obtained by drawing a silicon ingot from liquid silicon and then sawing the ingot into many wafers. Various layers are then formed on the wafer followed by a photoresist layer. A mask having openings therein is then located over the photoresist layer and a light source is located over the mask so that light shines through the openings onto selected areas of the photoresist layer. These selected areas change chemical composition so that they are subsequently selectively etched over areas of the photoresist layer that are not exposed to the light. The photoresist layer is then used as a mask to etch layers below the photoresist layer.

A cutting edge of a wire used for sawing the wafers makes a series of alternating raised and recessed formations on each wafer. The formations extend in a direction of the cutting edge and are spaced from one another in a direction in which the saw progresses through the wafer. These formations are reflected on the photoresist layer. The light source emanates a bundle of light which is wider than it is long, and, along its width, crosses over many of the formations at a given moment. The light has a uniform focal length across its width, usually about halfway between peaks of the raised formations and lower points of the recessed formations. The light is thus out of focus at the peaks and lower points, resulting in inaccurate exposure of the photoresist layer. Inaccurate exposure of the photoresist layer results in inaccurate dimensions of formations etched in layers below the photoresist layer.

BRIEF DESCRIPTION OF THE DRAWINGS

The invention is further described by way of example with reference to the accompanying drawings wherein:

FIG. 6b is a cross-sectional side view of Detail A on FIG. 6a.

DETAILED DESCRIPTION OF THE INVENTION

A method is described for improving the exposure focus for modern steppers used in the lithography of semiconductor substrates such as wafers. A wafer is sawed from a semiconductor ingot in a particular direction relative to a reference point on the ingot. As a result of the sawing, a series of raised and recessed formations manifest on the surface of the wafer. After various layers have been added to the wafer and the photoresist layer is ready to be removed, the wafer is aligned with the stepper so that a dynamic focus area of the stepper is aligned with the formations and/or the sawing direction. Such alignment improves the critical dimension control and reduces variability in printing small geometry features during lithography, resulting in higher yields.

Figure 1:
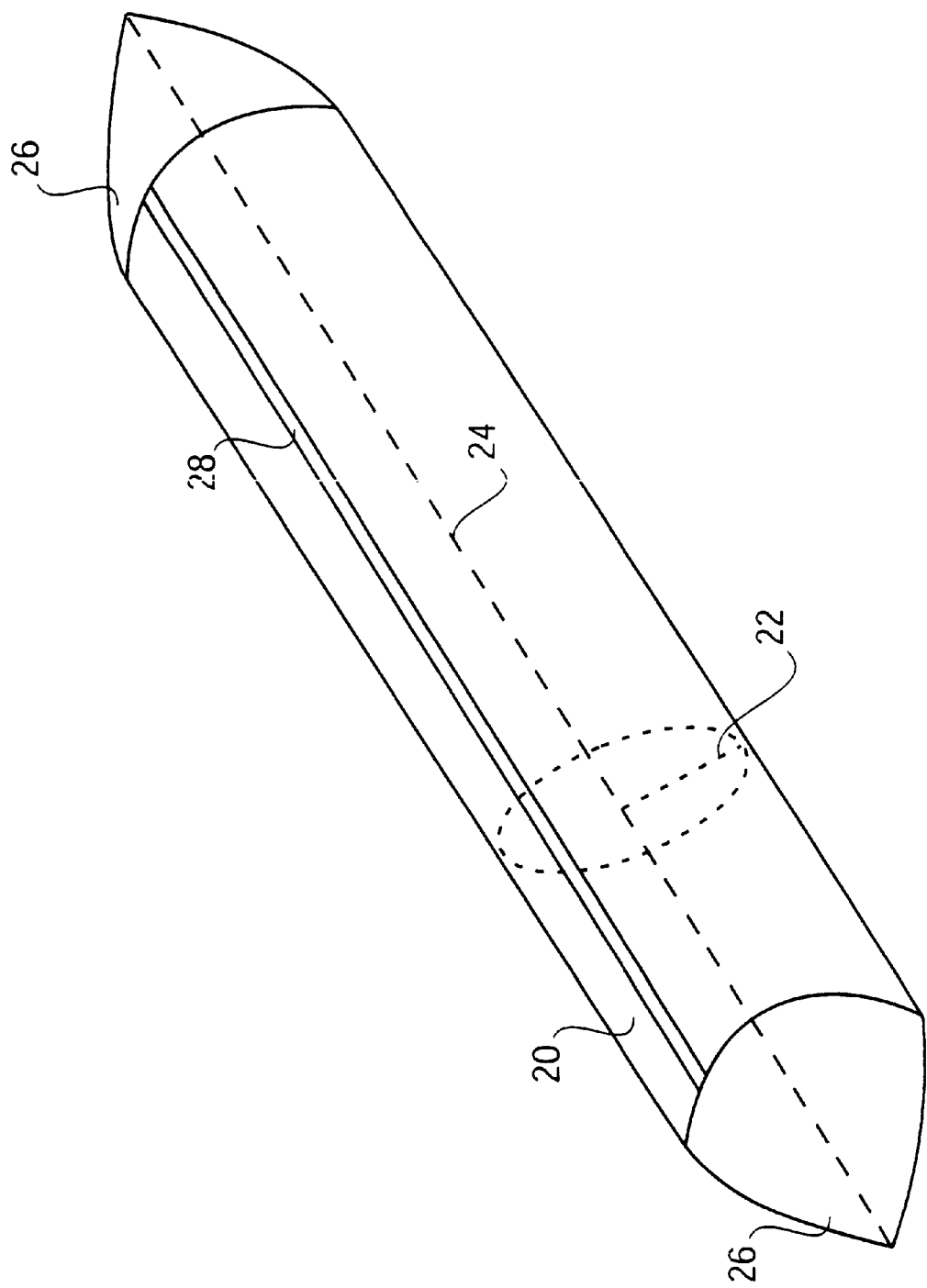
FIG. 1 is a perspective view of a semiconductor ingot.

Referring firstly to FIG. 1, a monocrystalline silicon ingot 20 is illustrated. The ingot 20 is cylindrical with a radius 22, a length along a central axis 24, two end sections 26, and a notch groove 28. The central axis 24 is a multiple of the radius 22. The end sections 26 taper to the central axis 24. A straight notch groove 28 is created parallel to the central axis 24 on a surface of the ingot 20 from one end section 26 to the other. The notch groove 28, in cross-section transversely through the central axis 24, has is "V-shaped" with a tip pointing at the central axis 24.

Figure 2:
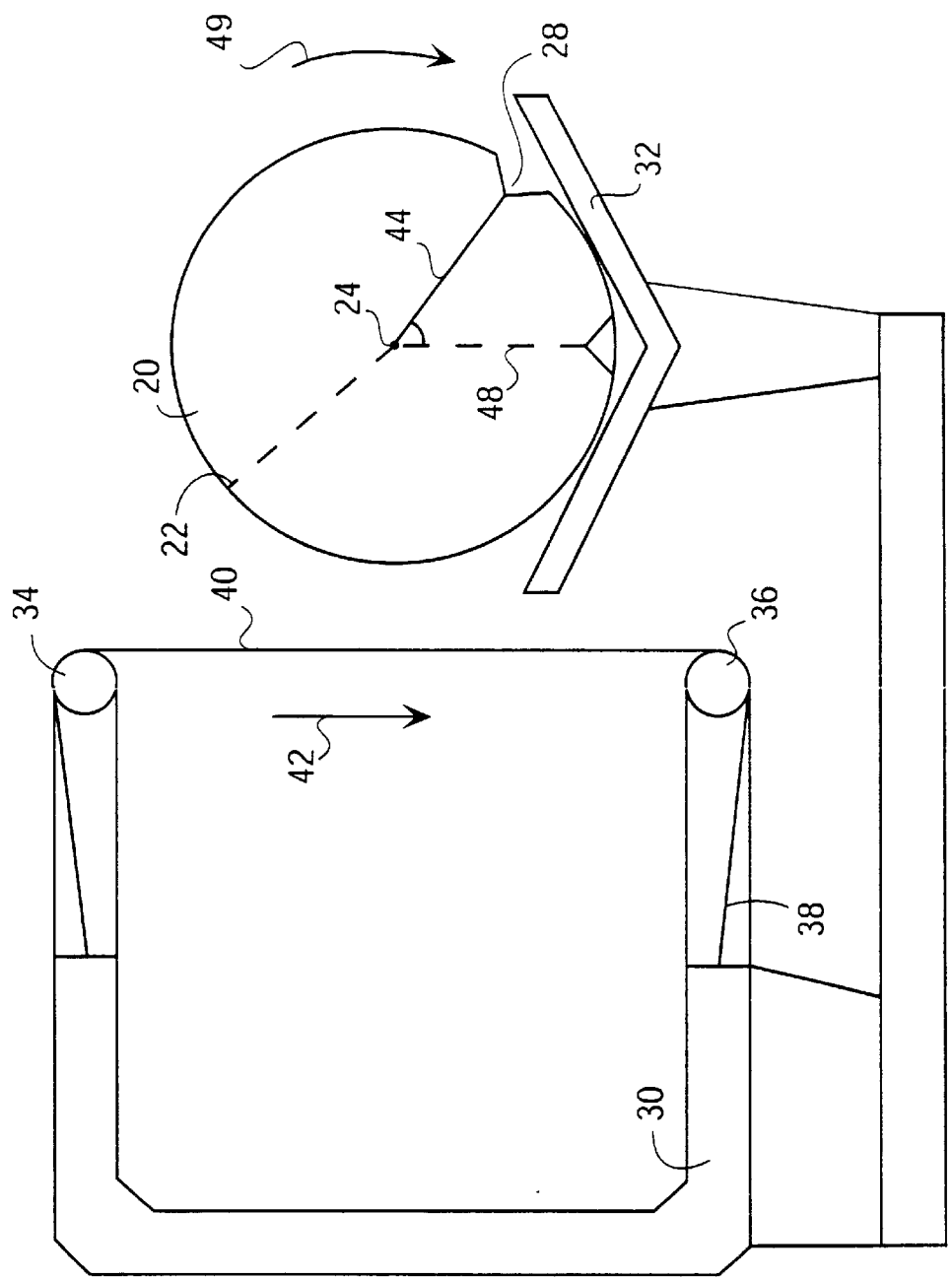
FIG. 2 is a cross-sectional end view of the ingot as it rests in a wire saw machine.

FIG. 2 illustrates the ingot 20 resting inside a wire saw machine 30. The wire saw machine 30 includes a jig 32, an upper spindle 34, a lower spindle 36, and a saw wire 38. Although not shown, it should be understood that wire saws commonly have more than one wire so that many substrates may be sawed at the same time. The jig 32 is "V-shaped" with a tip pointing downwards. The upper spindle 34 is located directly above the lower spindle 36 at a distance greater than twice the radius 22 of the ingot 20. The saw wire 38 includes a cutting edge 40 extending in an edge direction 42 and is located over and tensioned vertically between the upper spindle 34 and the lower spindle 36. Both spindles and the saw wire 38 are movable in unison relative to the jig 32 horizontally and in a direction parallel to the central axis 24. The ingot 20 rests inside the concave portion of the V-shaped jig 32. A line 44 can be drawn from the notch groove 28 to the central axis 24 of the ingot 20. At first, there is an original angle 46 between the line 44 and a vertical reference line 48 from the central axis 24. The vertical distance between the central axis 24 and both the upper spindle 34 and lower spindle 36 is at all times at least the radius 22 of the ingot 20. An operator then rotates the ingot 20 clockwise about the central axis 24 in a sawing rotation direction 49 so that the line 44 is vertical.

Figure 3:
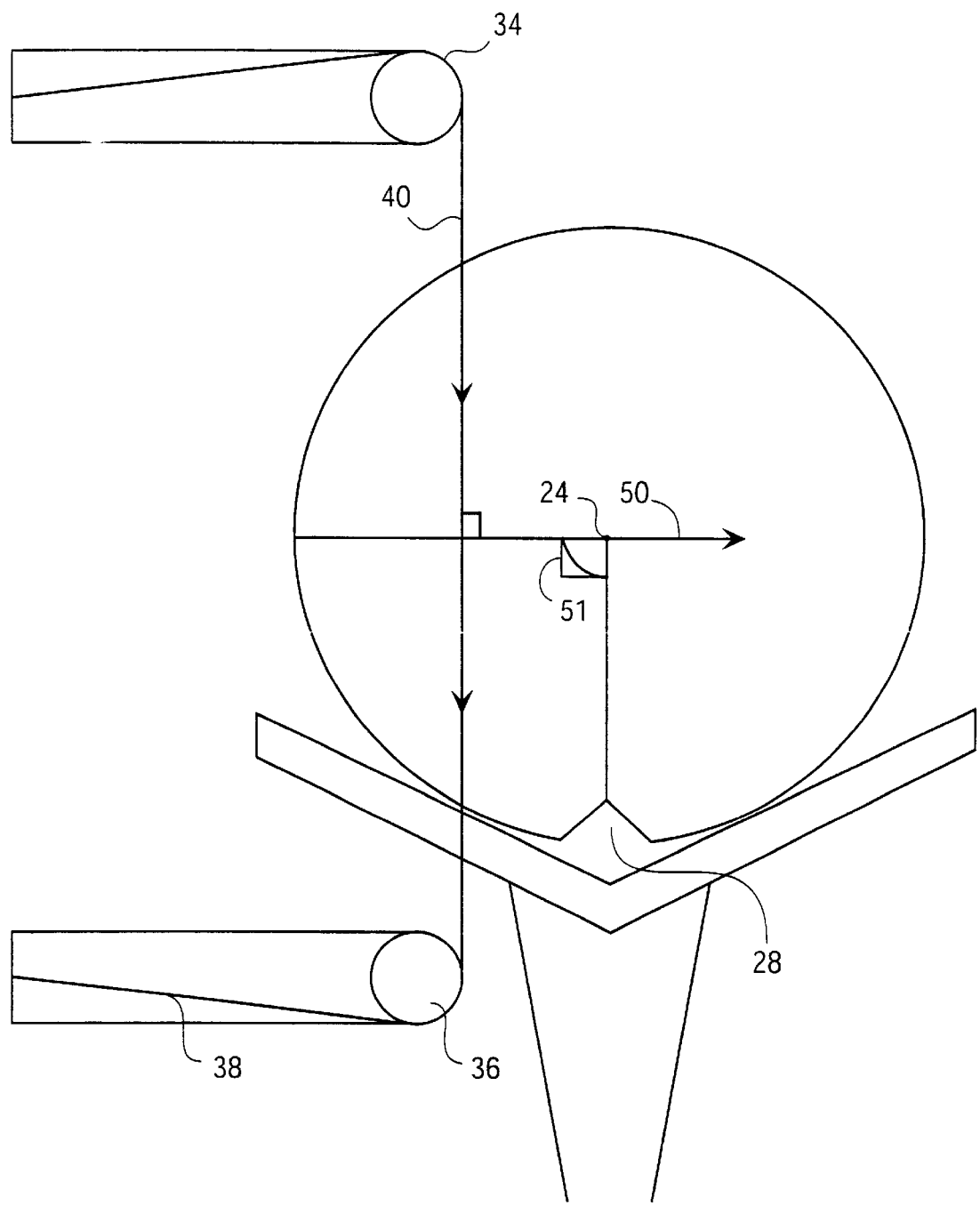
FIG. 3 is a view similar to FIG. 2 in enlarged detail while the ingot is being sawed.

FIG. 3 illustrates the ingot 20 being sawed. After the ingot 20 has been rotated, the upper spindle 34 and lower spindle 36 are rotated clockwise so that the saw wire 38 at the cutting edge 40 is moved vertically downwards. Both spindles are moved toward the jig 32 in a sawing direction 50, with a sawing angle 51 between the sawing direction and the line, perpendicular to the cutting edge 40, perpendicular to the central axis 24, and perpendicular to the line 44, from left to right on the paper. As the spindles are moved, the cutting edge 40 cuts through the ingot 20 intersecting the notch groove 28.

Figure 4:
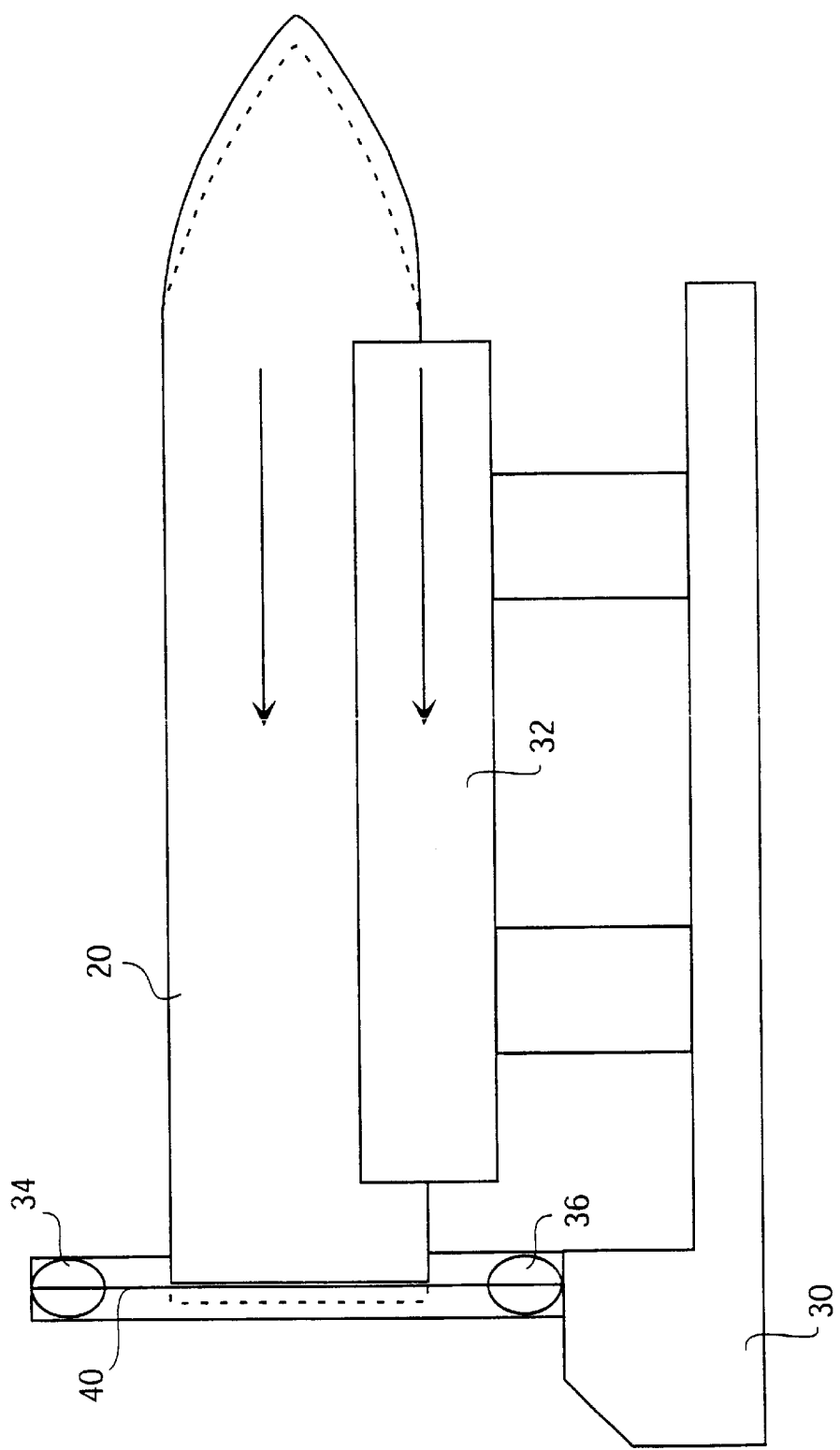
FIG. 4 is side view of the ingot as it rests in the wire saw.

FIG. 4 illustrates the ingot 20 being moved after it is sawed. After the cutting edge 40 cuts entirely through the ingot 20, the upper spindle 34 and lower spindle 36 return to positions shown in FIG. 2. An operator then moves the jig 32 along the central axis 24 so the sawing process indicated in FIG. 3 may be repeated.

Figure 5:
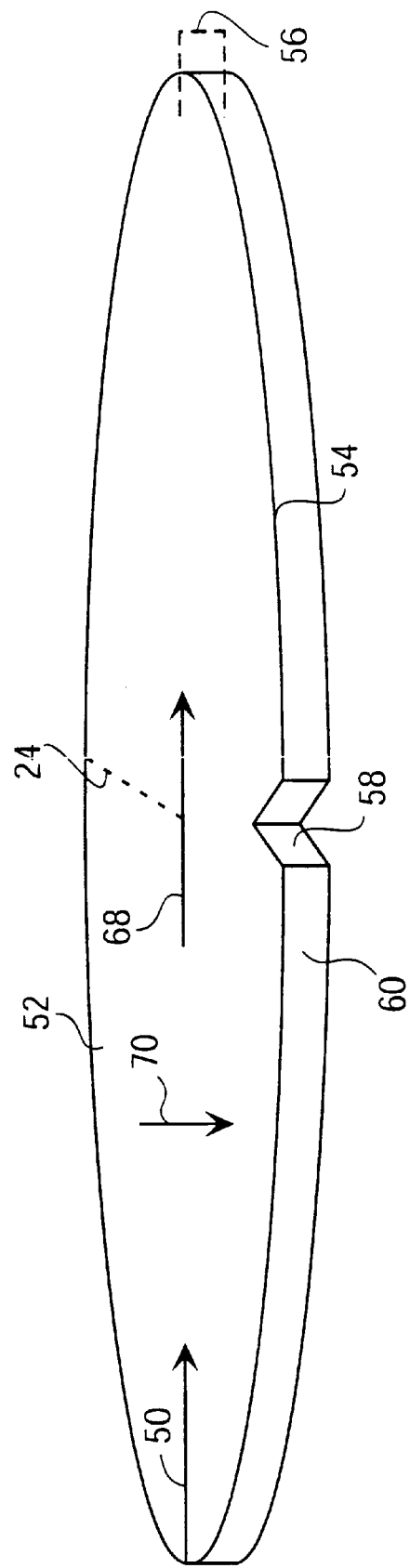
FIG. 5 is perspective view of the wafer after being cut from the ingot.

FIG. 5 illustrates a wafer 52 after being sawed from the ingot 20 in the previous figure. The wafer 52 has a wafer upper surface 54, a thickness 56, a notch 58, and the same radius 24 as the ingot 20. The thickness 56 is typically 750 microns. The notch 58 extends the entire thickness 56 and appears on an edge 60 of the wafer 52 due to the notch groove 28 on the ingot 20. The sawing direction 50 is left to right on the paper.

Figure 6A:
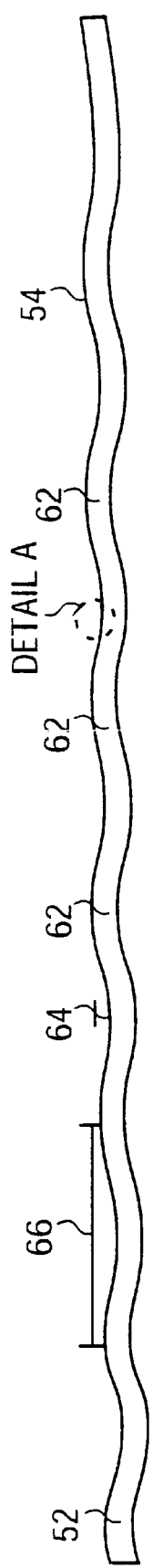
FIG. 6a is a cross-sectional side view of the wafer.
Figure 6B:
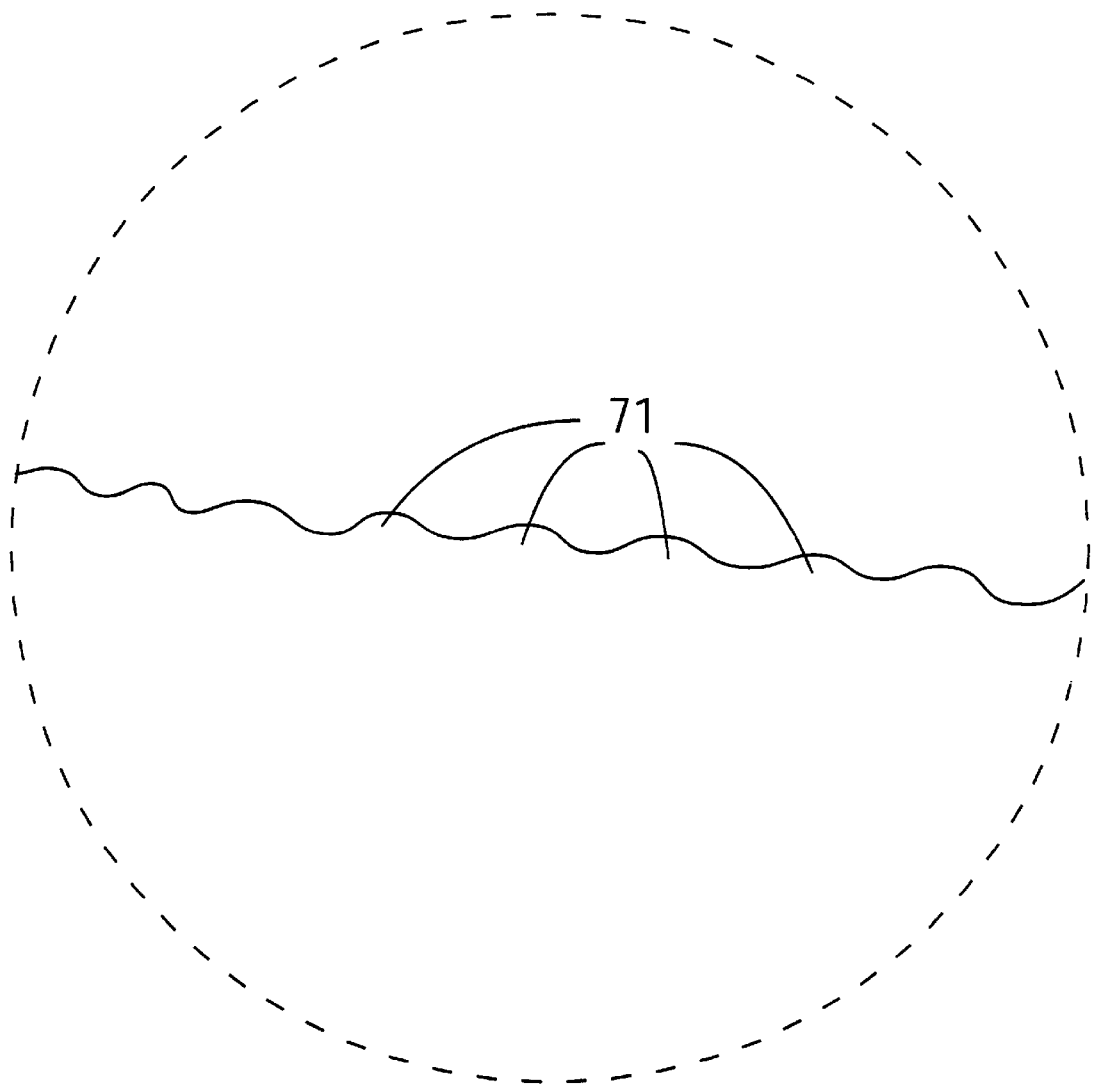

Referring to FIG. 6a in combination with FIG. 5, a series of raised and recessed nanotopologic formations 62 are formed on the wafer upper surface 54 when the wafer 52 is sawed. The nanotopologic formations 62 have heights 64 of between 10 and 100 nanometers and peak-to-peak distances 66 of 2 to 10 millimeters. The peak-to-peak distances 48 extend in a distance direction 68 along the sawing direction 50. The widths of these formations extend to the end of the substrate in a wave direction 70 parallel to the edge direction 42. Although not shown, it should be understood that other formations, some larger and some smaller than the nanotopologic formations are also present on the surface of the wafer and do contribute to the problem this invention is solving. FIG. 6b, a cross sectional side view of Detail A on FIG. 6a, illustrates some of the smaller formations 71 referred to collectively as "roughness." It should also be understood that the wafer, after it is sawed, undergoes a series of grinding and polishing processes which do eliminate some, but not all, of the raised and recessed formations.

Figure 7A:
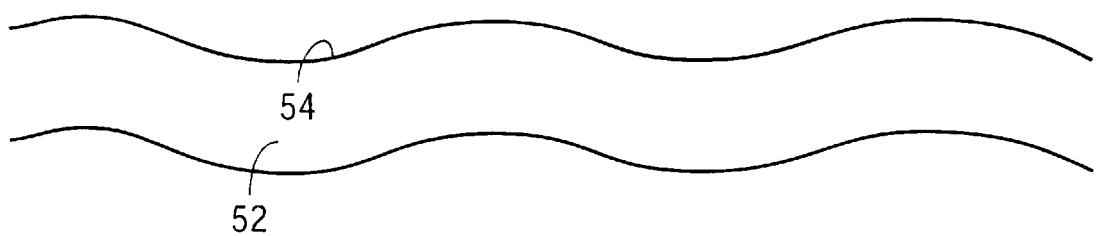
FIG. 7a is a view similar to FIG. 6a in enlarged detail.

FIG. 7a illustrates in enlarged detail the wafer 52 with no layers on it. The nanotopologic formations 62 are visible on the wafer upper surface 54. As illustrated in 7b, a selected layer 72 is formed on the wafer. Although not shown, it should be understood that the selected layer 72 in fact includes many layers located on one another. A selected upper surface 74 of the selected layer 72 has formations that reflect the formations on the wafer upper surface 54. As illustrated in FIG. 7c, a photoresist layer 76 is then formed on the selected layer 54. A photoresist upper surface 78 of the photoresist layer 76 has formations that reflect the formations on the selected upper surface 74. These formations have dimensions similar to those on the wafer upper surface 54.

Figure 7B:
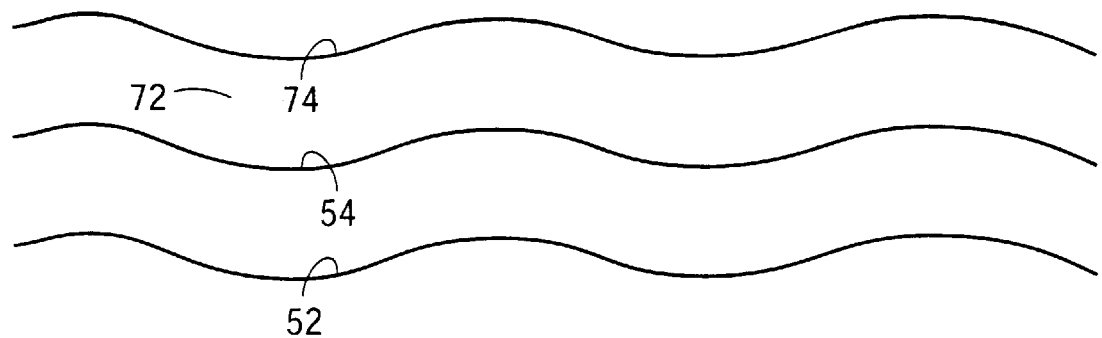
FIG. 7b is a cross-sectional side view of the wafer and a selected layer thereon.
Figure 7C:
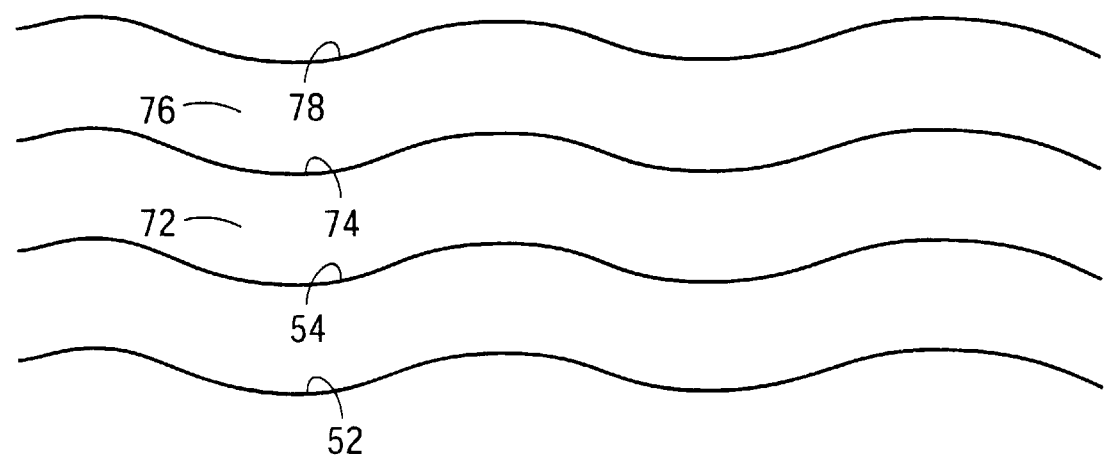
FIG. 7c is a cross-sectional side view of the wafer, selected layer, and photoresist layer formed on the selected layer.
Figure 8A:
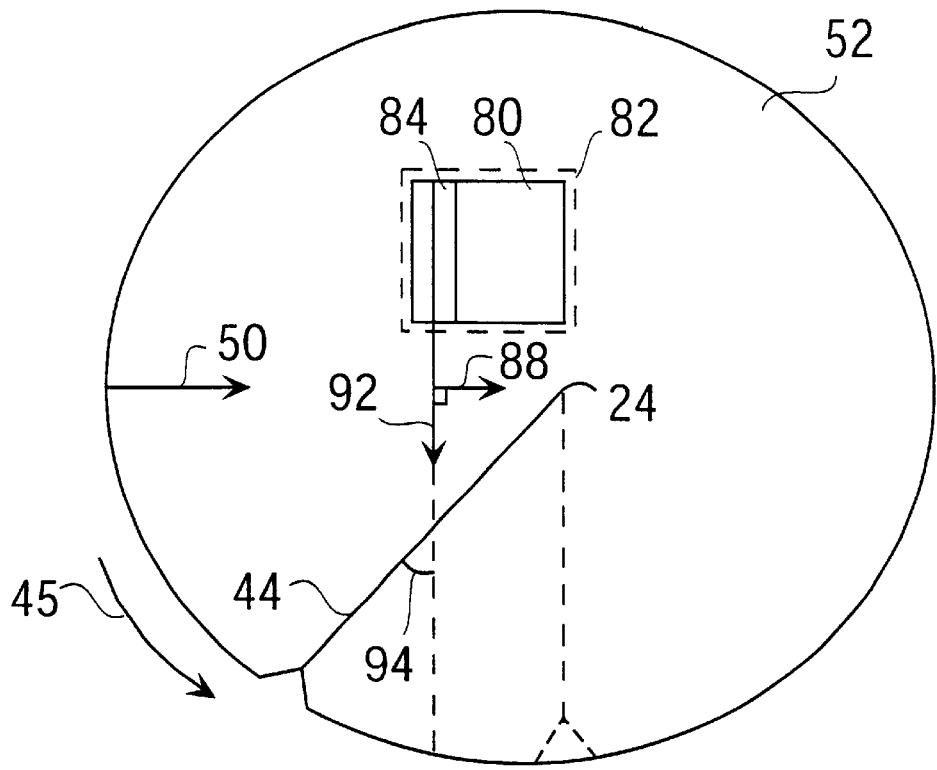
FIG. 8a is a plan view of the wafer, a mask, reticle field, and dynamic focus area.
Figure 9:
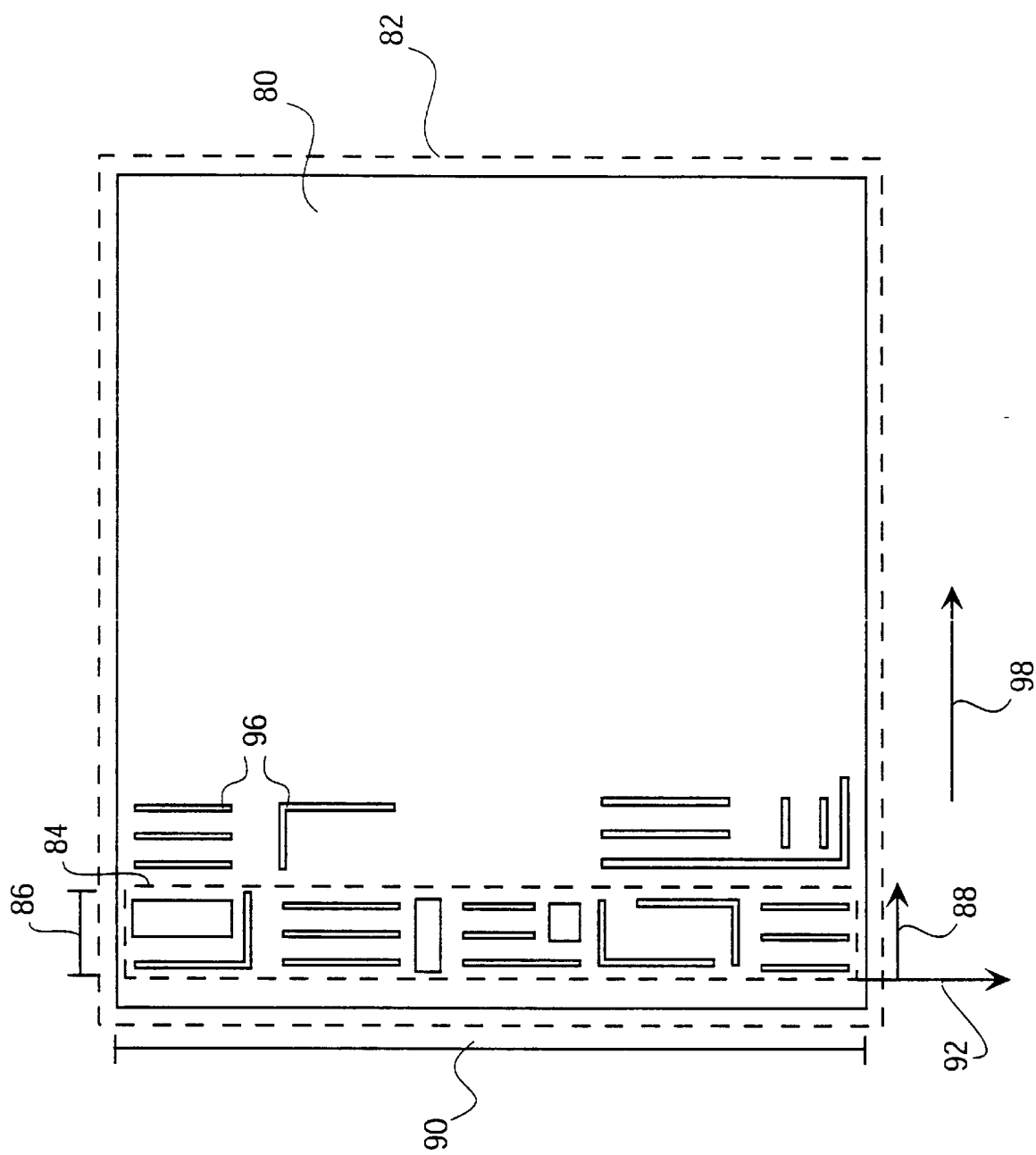
FIG. 9 is an exploded plan view of the mask, reticle field, and dynamic focus area.

FIG. 8a in combination with FIG. 9 illustrates the structure of FIG. 7c together with a mask 80 and electromagnetic radiation source, as indicated by the reticle field 82 and dynamic focus area 84, have been place over the wafer 52. The mask 80 and the reticle field 82 are both square and approximately the same size with sides approximately 20 millimeters. The dynamic focus area 84 is essentially a bundle of optical light, from the electromagnetic radiation source, with a length 86 extending in a length direction 88 and a width 90 extending in a width direction 92 perpendicular to the length direction 88. The width 90 of the bundle is a multiple of the length 86. The width 90 of the bundle is approximately the same as the length of one side of the reticle field 82. The length 86 of the bundle is approximately 2 micrometers.

FIG. 8a in combination with FIG. 9 illustrates the original orientation of the wafer 52 under the reticle field 82. There is a stepper angle 94 between the width direction 92 and the line 44. The operator rotates the wafer 52 counterclockwise about the central axis 24 in a stepper rotation direction 95 so that the stepper angle 94 is zero.

Figure 8B:
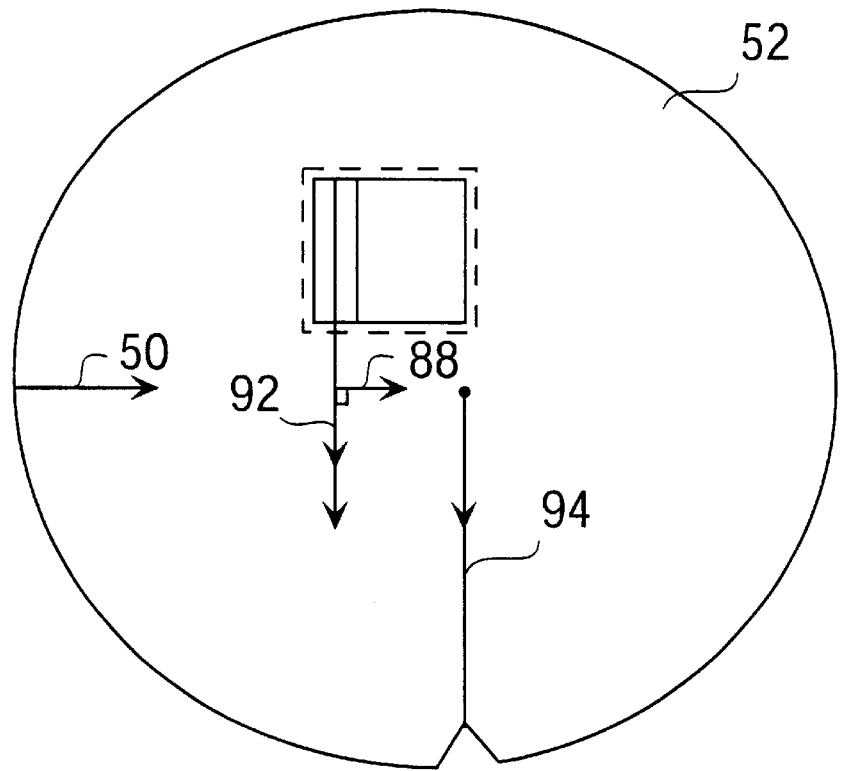
FIG. 8b is a view similar to FIG. 2 after rotation of the wafer.

FIG. 8b illustrates the wafer 52 after being rotated. The light source is aligned with the wafer 52 so that the width direction 92 is parallel to the wave direction 70, and the length direction 88 is parallel to the distance direction 68. FIG. 8a illustrates the wafer 52 with an initial stepper angle 94 of approximately 30° being rotated counterclockwise until the stepper angle 94 is 0°, the width direction 92 is parallel to the line 44, and the length direction 88 is parallel to the sawing direction 50, as illustrated in FIG. 8b.

FIG. 9 illustrates the mask 80, the reticle field 82, and the dynamic focus area 84 in more detail. The mask 80 has openings 96 therein through which light from the light source propagates. The widths of the openings 96 are between 0.13 and 2 microns depending on the dimensions of desired features on the wafer 52. Although not shown, it should be understood that the openings 96 cover the entire mask 80. The dynamic focus area 84 is scanned in a scanning direction 98 parallel to the length direction 88, distance direction 68, and sawing direction 50. The scan extends to cover the entire reticle field 82.

Figure 10:
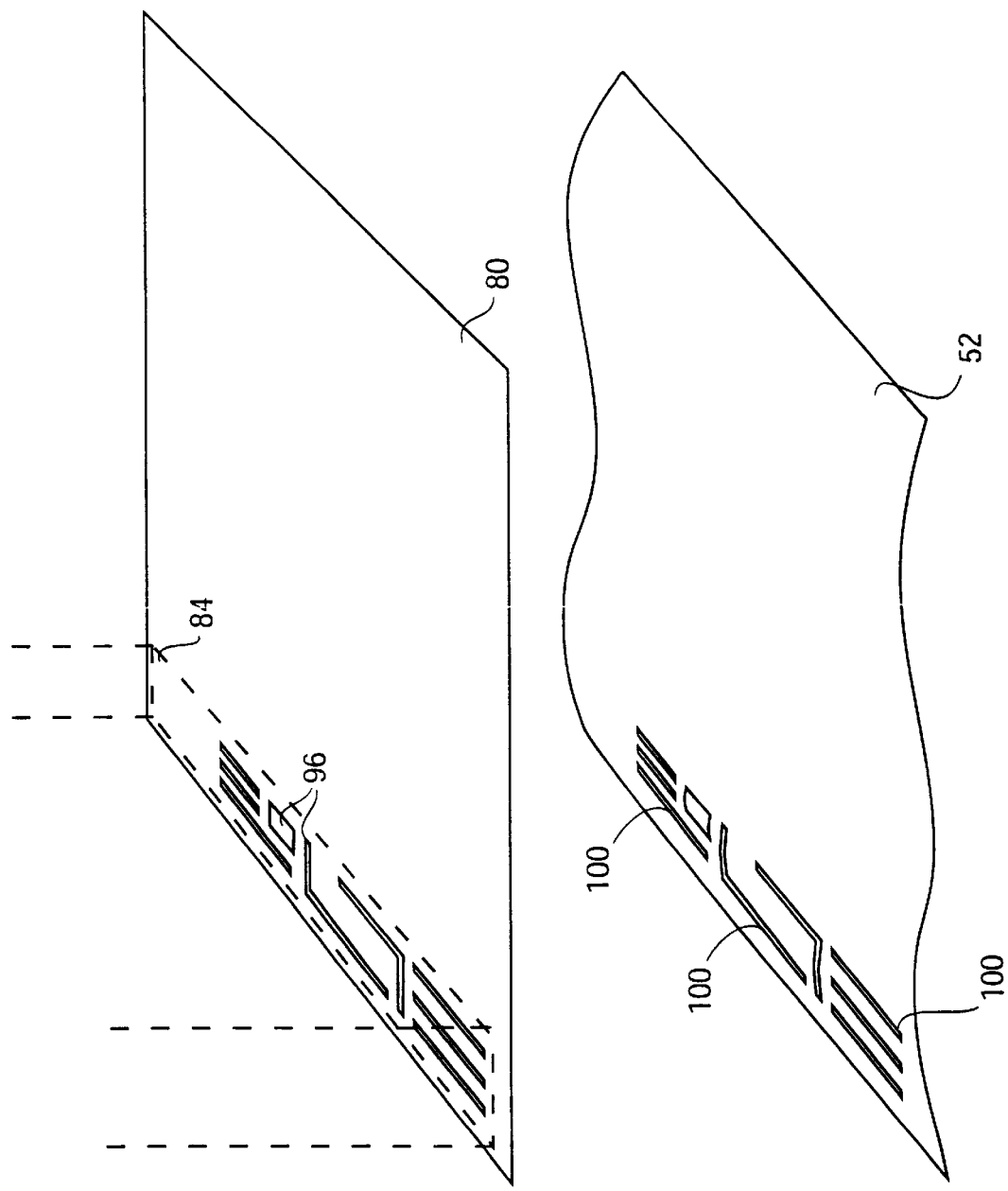
FIG. 10 is a perspective side view of the mask over the substrate.

FIG. 10 illustrates the mask 80 located over the wafer 52 as light (electromagnetic radiation) from the light source propagates through the openings 96. Because of the alignment of the dynamic focus area 84 with the formations on the wafer 52, particularly the nanotopology of the wafer 52, selected areas 100 of the photoresist layer 76 being exposed by the light propagating through openings 96, at any given time, are approximately the same height. The light source can focus light to a single particular depth at any given time. Therefore, a greatly increased portion of the light exposing the selected areas 100 will be in focus when it reaches the photoresist layer 76, resulting in accurate exposure of the photoresist layer 76. Accurate exposure of the photoresist layer 76 results in accurate dimensions of the selected areas 100 to match the dimensions of the openings 96. This results in accurate exposure of formations etched in layers below the photoresist layer 76 and thus higher yields.

Figure 11A:
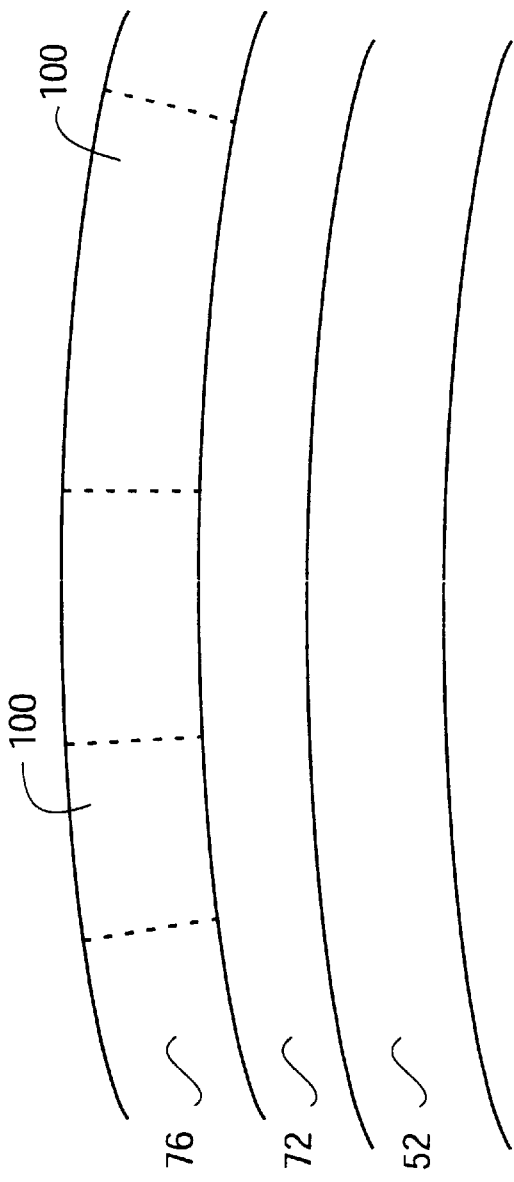
FIG. 11a is a cross-sectional side view of the wafer just before the selected areas have been exposed.

FIG. 11a illustrates the wafer 52 with the selected layer 72 and photoresist layer 76 before exposure of the selected areas 100 to light.

Figure 11B:
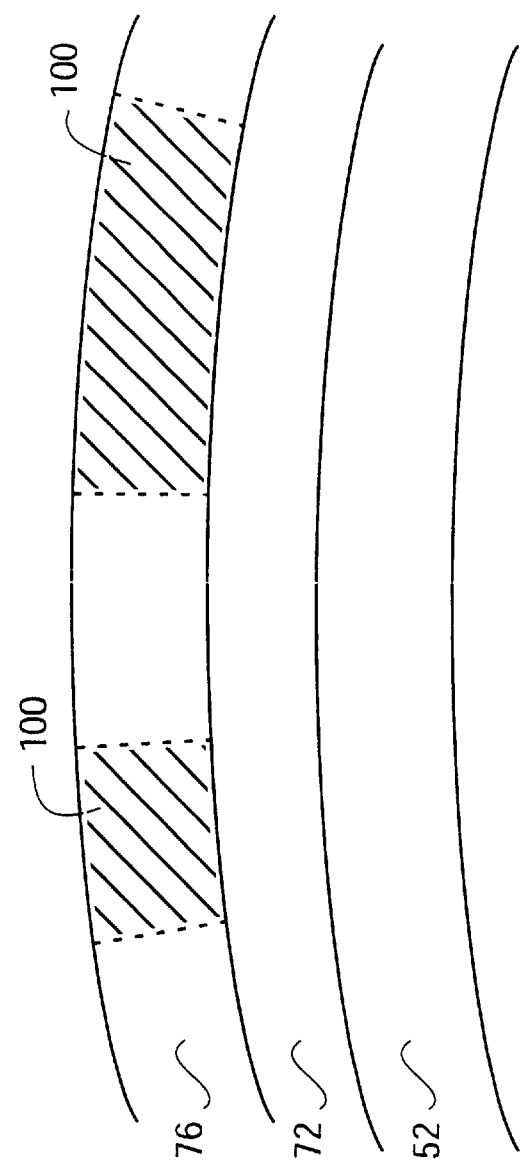
FIG. 11b is a view similar to FIG. 11a after the selected areas have been exposed.

FIG. 11b illustrates the wafer 52 after exposure of the selected areas 100 to light. The composition of the selected areas 100 has changed.

Figure 12:
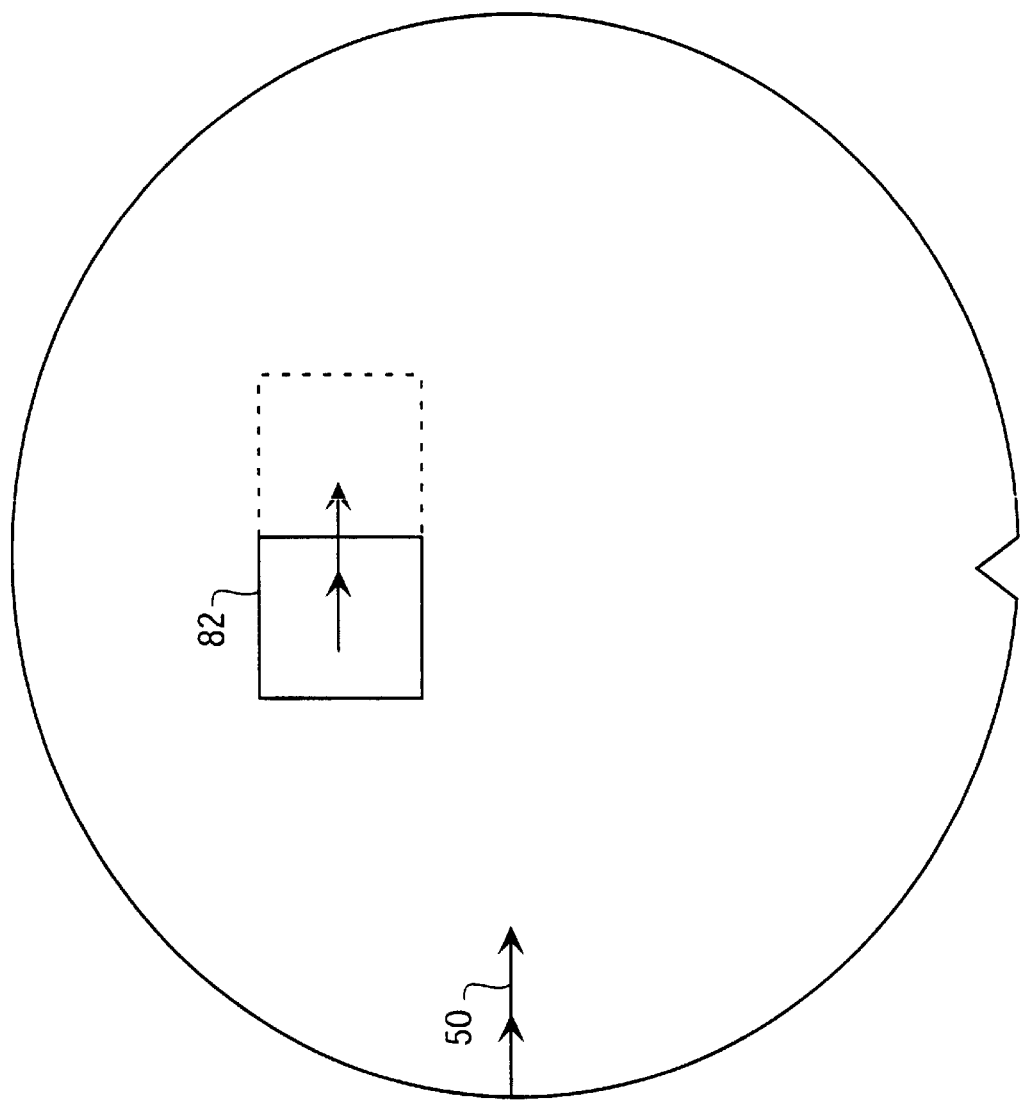
FIG. 12 is a plan view of the wafer, the mask, reticle field, and dynamic focus area.

FIG. 12 illustrates the configuration similar to that in FIG. 7. After the dynamic focus area 84 has been scanned across the entire reticle field 82, the light source moves relative to the wafer 52 causing the reticle field 82 to move so that it is located over a region of the wafer 52 where the selected areas 100 have not be exposed. FIG. 12 illustrates the reticle field 82 moving approximately 20 millimeters in a direction parallel to the sawing direction 50, left to right on the page. After the reticle field 82 has been repositioned, the process depicted in FIGS. 9 to 11 is repeated. The process depicted in FIGS. 9 to 12 is repeated until the all of the selected areas 100 on the wafer 52 have been exposed.

Figure 13A:
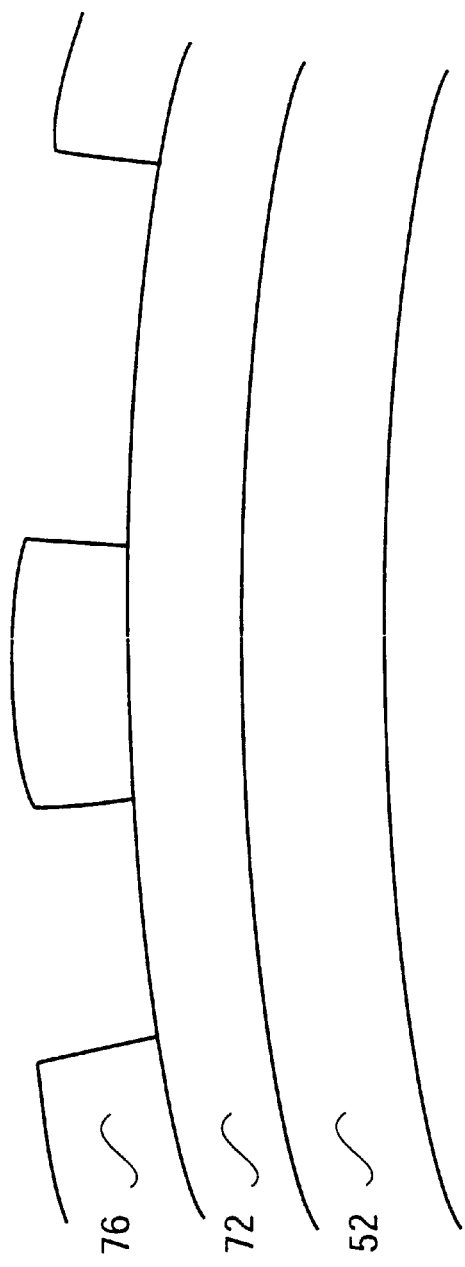
FIG. 13a is a cross-sectional side view of the wafer after the photoresist of the selected areas has been removed.

FIG. 13*a* illustrates the wafer 52 after the mask 80 and the light source have been removed. The selected areas 100 have been etched to reveal the selected layer 72 below. The remainder of the photoresist layer 76, all but the selected areas 100, has not been substantially affected.

Figure 13B:
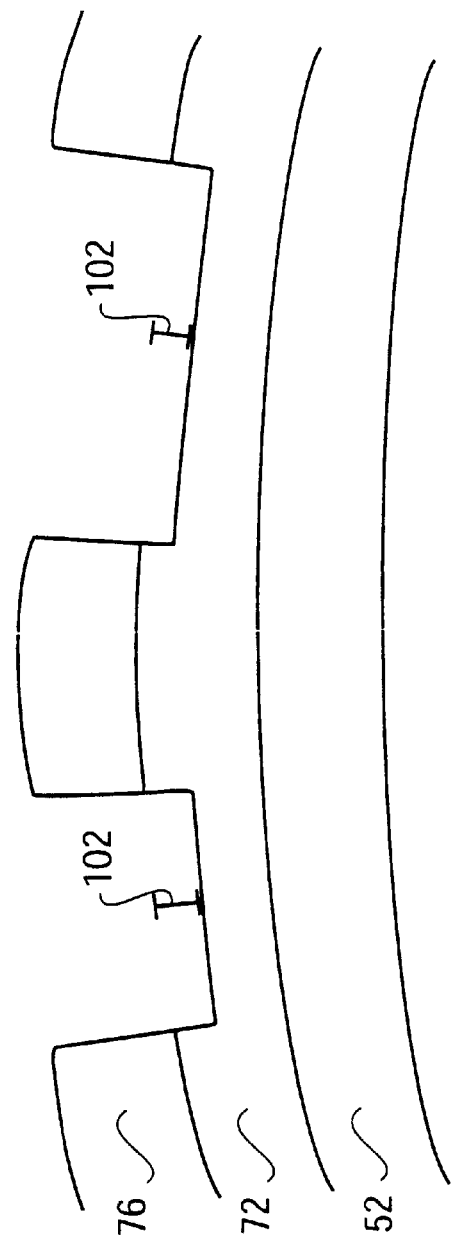
FIG. 13b is a view similar to FIG. 13a after the selected layer has been etched.

FIG. 13*b* illustrates the wafer 52 after the selected layer 72 has been etched. The selected layer 72 is etched to a selected etch depth 102. This etching process only affects the selected layer 72. The remainder of the photoresist layer 76 has not been substantially affected.

Figure 13C:
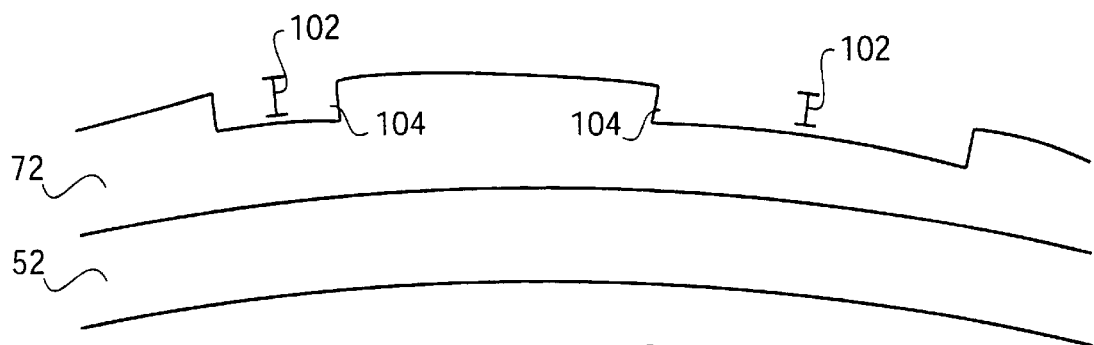
FIG. 13c is a view similar to FIG. 13b after the remainder of the photoresist has been removed.

FIG. 13*c* illustrates the wafer 52 after the remainder of the photoresist layer 76 has been removed. The photoresist layer 76 has been completely removed from the wafer 52. The only features now present on the selected layer 72 are trenches 104 of the selected etch depth 102.

Figure 13D:
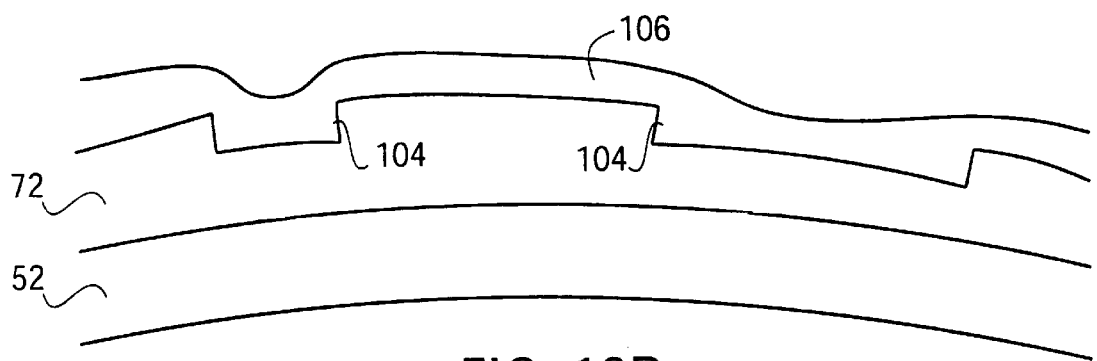
FIG. 13d is a view similar to FIG. 13c after the aluminum layer has been added.

FIG. 13*d* illustrates the wafer 52 after an aluminum layer 106 has been added on top of the selected layer 72. The aluminum layer 106 is at least deep enough to completely fill in the trenches 104.

Figure 13E:
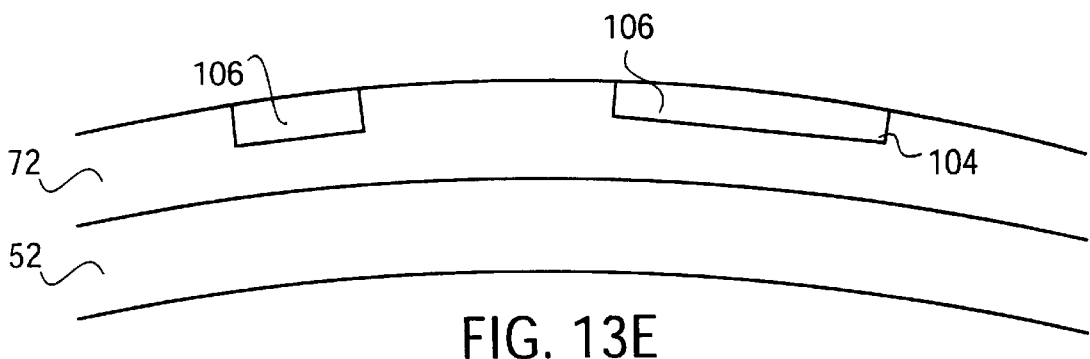
FIG. 13e is a view similar to FIG. 13d after the aluminum layer has been etched.

FIG. 13*e* illustrates the wafer 52 after the aluminum layer 106 has been polished. Aluminum components now lay in the trenches 104 only.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed:

1. A method of patterning a photoresist layer comprising:
    forming a selected layer over a semiconductor substrate, the selected layer having a plurality of alternating raised and recessed selected formations reflected on an upper surface thereof due to alternating raised and recessed substrate formations on an upper surface of the substrate;
    forming a photoresist layer over the selected layer, the photoresist layer having a plurality of raised and recessed photoresist formations reflected on an upper surface thereof due to the selected formations on the upper surface of the selected layer, peaks of successive raised photoresist formations being separated by a distance extending in a distance direction and each raised formation having a width extending in a wave direction transverse to the distance direction, the width being a multiple of the distance;
    locating a mask over the photoresist layer, the mask having a plurality of openings; and
    positioning an electromagnetic radiation source over the mask, the electromagnetic radiation source emanating a bundle of electromagnetic radiation having a length and a width transverse to the length, the width being a multiple of the length, the electromagnetic radiation source being aligned with the substrate so that the length of the bundle of electromagnetic radiation extends in a length direction which is substantially parallel to the distance direction, the electromagnetic radiation propagating through the openings in the mask onto selected areas of the photoresist layer so as to change the material of the selected areas into a material which can be selectively etched over a remainder of the photoresist layer.

2. The method of claim 1 further comprising:
    sawing the substrate from an ingot prior to forming the selected layer, the ingot being sawed in a sawing direction with a sawing angle between the sawing direction and a line between a central axis of the ingot and a reference point on the ingot located distant from the central axis of the ingot, the substrate having, as a result of the sawing, a plurality of alternating raised and recessed substrate formations reflected on an upper surface thereof.

3. The method of claim 2 further comprising:
    rotating the ingot prior to sawing so that the substrate is sawed in a preselected sawing direction with a preselected sawing angle between the preselected sawing direction and the line.

4. The method of claim 2 wherein the reference point located distant from the central axis of the ingot is a first formation which is engageable by a second formation to rotate the ingot about it's central axis.

5. The method of claim 2 wherein the reference point located distant from the central axis of the ingot is a notch.

6. The method of claim 1 further comprising:
    removing the mask; and
    selectively etching the selected areas over the remainder of the photoresist layer.

7. The method of claim 1 wherein the substrate is silicon.

8. The method of claim 1 wherein the selected layer is a dielectric material.

9. The method of claim 1 wherein there is a plurality selected layers.

10. The method of claim 1 wherein the raised and recessed formations include nanotopologic formations with heights of approximately 10 to 100 nanometers, distances between successive peaks of raised formations of approximately 2 to 10 millimeters, and widths, each extending to an edge of the substrate.

11. The method of claim 1 wherein the bundle of electromagnetic radiation is moved relative to the substrate in a scanning direction which is substantially parallel to the distance direction and substantially parallel to the length direction.

12. The method of claim 1 wherein the electromagnetic radiation source is an optical light source.

13. The method of claim 1 wherein the width of the bundle of electromagnetic radiation is at least one hundred times its length.

14. The method of claim 1 wherein the width of the bundle of electromagnetic radiation is at least one thousand times its length.

15. The method of claim 1 wherein the bundle of electromagnetic radiation has a length of approximately 2 micrometers and a width of 20 millimeters.

16. A method comprising:
    sawing a substrate from a semiconductor ingot, the ingot being sawed in a sawing direction with a sawing angle between the sawing direction and a line between a central axis of the ingot and a reference point on the ingot located distant from the central axis of the ingot;
    forming a selected layer over the substrate;
    forming a photoresist layer of a material over the selected layer;

locating a mask over the photoresist layer, the mask having a plurality of openings therein; and positioning an electromagnetic radiation source over the mask, the electromagnetic radiation source emanating a bundle of electromagnetic radiation having a length and a width transverse to the length, the width being a multiple of the length, the electromagnetic radiation source being aligned with the substrate so that the length of the bundle of electromagnetic radiation extends in a length direction with a scanning angle between the length direction and the line, the scanning angle being substantially equal to the sawing angle, the electromagnetic radiation propagating through the openings in the mask onto selected areas of the photoresist layer so as to change the material of the selected areas into a material which can be selectively etched over a remainder of the photoresist layer.

17. The method of claim 16 wherein the ingot is sawed with a wire saw.

18. The method of claim 16 wherein the ingot is sawed in a direction which is substantially perpendicular to the central axis of the ingot.

19. The method of claim 16 further comprising:

rotating the ingot about the central axis thereof prior to sawing the ingot.

20. A method of patterning a photoresist layer comprising:

moving a saw blade through a semiconductor ingot to saw a substrate from the ingot, the saw blade having a cutting edge extending relative to the substrate in an edge direction;

forming a selected layer over the substrate;

forming a photoresist layer of a material over the selected layer;

locating a mask having a plurality of openings over the photoresist layer; and positioning an electromagnetic radiation source over the mask emanating a bundle of electromagnetic radiation having a length and a width transverse to the length, the width being a multiple of the length, the electromagnetic radiation source being aligned with the substrate so that the length of the bundle of electromagnetic radiation extends in a length direction substantially perpendicular to the edge direction, the electromagnetic radiation propagating through the openings in the mask onto selected areas of the photoresist layer.

21. The method of claim 20 wherein the ingot is sawed with a wire saw.

22. The method of claim 20 wherein the ingot is sawed in a direction which is substantially perpendicular to a central axis of the ingot.

23. The method of claim 20 further comprising:

rotating the ingot about a central axis thereof prior to sawing the ingot.

24. A method comprising:

rotating a semiconductor ingot about a central axis;

sawing a substrate from the semiconductor ingot, the ingot being sawed in a sawing direction with a sawing angle between the sawing direction and a line between the central axis of the ingot and a reference point on the ingot located distant from the central axis of the ingot, the substrate having, as a result of the sawing, a plurality of alternating raised and recessed substrate formations reflected on an upper surface thereof;

forming a selected layer over the substrate, the selected layer having a plurality of alternating raised and recessed formations reflected on an upper surface thereof due to the substrate formations on the upper surface of the substrate;

forming a photoresist layer of a material over the selected layer, the photoresist layer having a plurality of alternating raised and recessed formations reflected on an upper surface thereof due to the formations on the upper surface of the selected layer, peaks of successive raised photoresist formations being separated by a distance extending in a distance direction and each raised formation having a width extending in a wave direction transverse to the distance direction, the width being a multiple of the distance;

rotating the substrate about the central axis;

locating a mask over the photoresist layer, the mask having a plurality of openings therein;

positioning an electromagnetic radiation source over the mask, the electromagnetic radiation source emanating a bundle of electromagnetic radiation having a length and a width transverse to the length, the width being a multiple of the length, the electromagnetic radiation source being aligned with the substrate so that the length of the bundle of electromagnetic radiation extends in a length direction with a scanning angle between the length direction and the line, the scanning angle being substantially equal to the sawing angle, the length direction being substantially parallel to the distance direction, the electromagnetic radiation propagating through the openings in the mask onto selected areas of the photoresist layer so as to change the material of the selected areas into a material which can be selectively etched over a remainder of the photoresist layer;

removing the mask; and selectively etching the selected areas over the remainder of the photoresist layer.

25. The method of claim 24 wherein:

a plurality of semiconductor ingots are rotated about the central axes thereof;

a plurality of substrates are sawed from the plurality of semiconductor ingots, the plurality of semiconductor ingots being sawed in a sawing direction with a sawing angle between the sawing direction and a line between the central axes of the plurality of ingots and a reference point located on the ingot distant from the central axes of the plurality of ingots, the plurality of substrates having, as a result of the sawing, a plurality of alternating raised and recessed substrate formations reflected on the upper surfaces thereof;

a plurality of selected layers are formed over the plurality of substrates, the plurality of selected layers having a plurality of alternating raised and recessed formations reflected on the upper surfaces thereof due to the formations on the upper surfaces of the plurality of substrates;

a plurality of photoresist layers of a material are formed over the plurality of selected layers, the plurality of photoresist layers having a plurality of alternating raised and recessed formations reflected on the upper surfaces thereof due to the formations on the upper surfaces of the plurality of selected layers, peaks of successive raised formations being separated by a distance extending in a distance direction and each raised formation having a width extending in a wave direction transverse to the distance direction, the width being a multiple of the distance;

the plurality of substrates are rotated about the central axes;

a plurality of masks are located over the plurality of photoresist layers, the plurality of masks having a plurality of openings therein;

a plurality of electromagnetic radiation sources are positioned over the plurality of masks, the plurality of electromagnetic radiation sources emanating a plurality of bundles of electromagnetic radiation having a length and a width transverse to the length, the width being a multiple of the length, the plurality of electromagnetic radiation sources being aligned with the plurality of substrates so that the length of the plurality of bundles of electromagnetic radiation extends in a length direction with a scanning angle between the length direction and the line, the scanning angle being substantially equal to the sawing angle, the length direction being substantially parallel to the distance direction, the electromagnetic radiation propagating through the openings in the plurality of masks onto a plurality of selected areas of the plurality of photoresist layers so as to change the material of the selected areas into a material which can be selectively etched over a remainder of the photoresist layer;

the plurality of masks are removed; and the plurality of selected areas are selectively etched over the remainder of the plurality of photoresist layers.

26. The method of claim 24 wherein the raised and recessed formations include nanotopologic formations with heights of approximately 10 to 100 nanometers and distances between successive peaks of raised formations of approximately 2 to 10 millimeters.

27. The method of claim 24 wherein the bundle of electromagnetic radiation is moved relative to the substrate in a scanning direction which is substantially parallel to the distance direction and substantially parallel to the length direction.

28. The method of claim 24 wherein the electromagnetic radiation source is an optical light source.

* * * * *